United States Patent [19]
Walker

[11] 4,075,577
[45] Feb. 21, 1978

[54] ANALOG-TO-DIGITAL CONVERSION APPARATUS

[75] Inventor: Ernest Lee Walker, Wappingers Falls, N.Y.

[73] Assignee: International Business Machines Corporation, Armonk, N.Y.

[21] Appl. No.: 537,150

[22] Filed: Dec. 30, 1974

[51] Int. Cl.² .............................................. H03B 3/04
[52] U.S. Cl. ........................................ 331/17; 331/16; 340/347 AD
[58] Field of Search ....................... 331/16, 25, 18, 17; 340/347

[56] References Cited

U.S. PATENT DOCUMENTS

| | | | |
|---|---|---|---|
| 3,130,376 | 4/1964 | Ross | 331/18 |
| 3,247,491 | 4/1966 | Du Vall | 307/234 |
| 3,435,367 | 3/1969 | Little, Jr. | 331/16 |
| 3,731,219 | 5/1973 | Mader | 331/25 |
| 3,805,182 | 4/1974 | Melcher | 331/16 |
| 3,805,192 | 4/1974 | Ocnascher | 331/25 |
| 3,879,676 | 4/1975 | Schulz | 331/25 |
| 3,883,817 | 5/1975 | Cliff | 331/25 |
| 3,914,760 | 10/1975 | Logue | 331/25 |

FOREIGN PATENT DOCUMENTS

1,113,843  5/1968  United Kingdom .................. 331/16

OTHER PUBLICATIONS

Pulse Techniques, TM 11-672, Oct. 1951, pp. 44-46.

*Primary Examiner*—John Kominski
*Attorney, Agent, or Firm*—Robert Lieber

[57] ABSTRACT

An improvement over an analog-to-digital converter in which a phase-locked loop (including a voltage controlled oscillator, a feedback path, and a phase discriminator) supplies clocking signals to a counter. The clocking signals are gated to the counter by a circuit which energizes a gate in response to a known reference signal and deenergizes an gate in response to the unknown source signal. The resultant count in a measure of the phase difference between the source and reference signals. Accuracy and stability derive from maintenance of a predetermined phase-locked relationship between a signal derived through frequency division of the loop output signal and the cyclic reference signal which is the reference for gating the counts to the counter. The loop output frequency is a harmonic of the frequency of the reference signal. Feedback phase control is developed through interaction of the frequency divided loop output signal with the reference signal in the phase discriminator circuit. The present invention improves the accuracy of the phase-locked loop by making the voltage controlled oscillator ripple waveform linear. This is accomplished by placing a frequency divider in series with the loop, another identical frequency divider in the feedback path, and using an integrator to filter the phase discriminator output.

5 Claims, 5 Drawing Figures

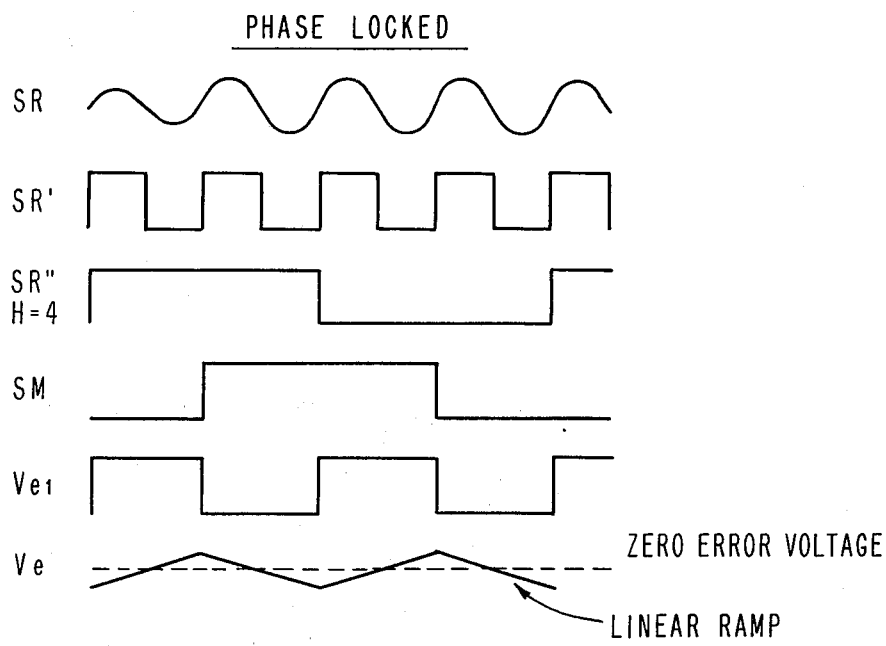
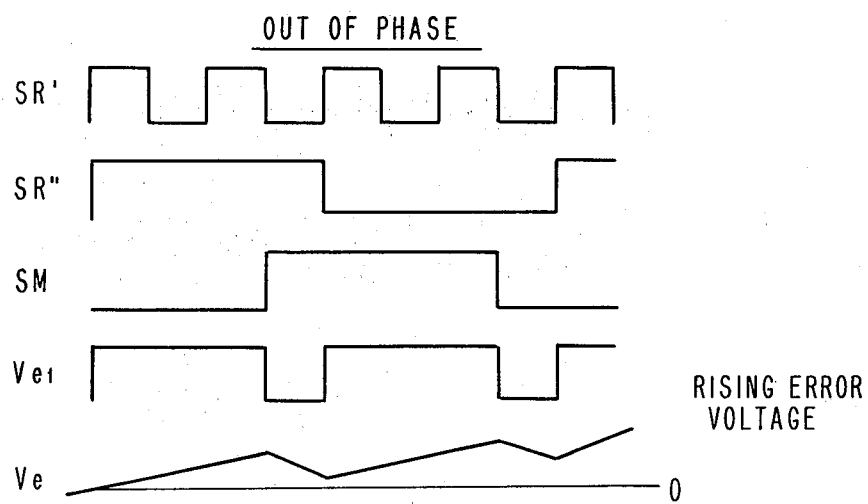
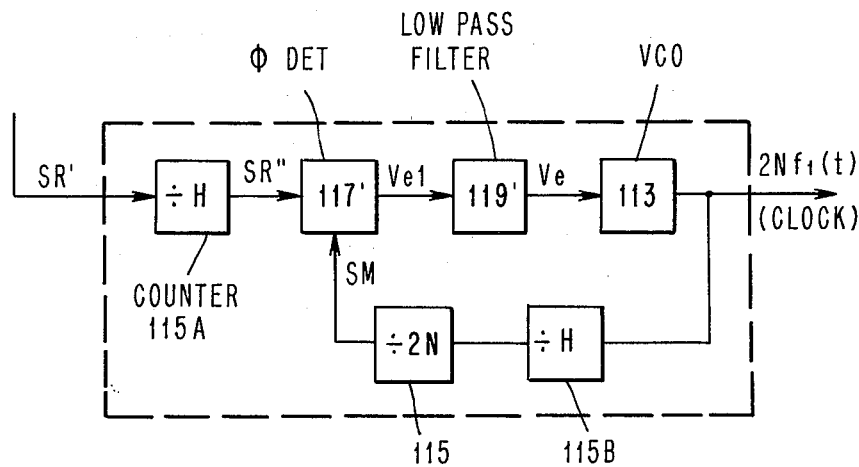

ANALOG-TO-DIGITAL CONVERSION APPARATUS

FIELD OF THE INVENTION

The present invention relates to analog/digital conversion systems and more particularly to a system for measuring scalor quantities, such as, angle, position, time, voltage, etc.

CROSS-REFERENCE TO RELATED APPLICATION

The present invention is an improvement over the apparatus disclosed in copending application Ser. No. 316,389 entitled "Accurate and Stable Encoding With Low Cost Circuit Elements" filed by Joseph C. Logue on Dec. 20, 1972 and assigned to the present assignee, which application is incorporated herein by reference.

DESCRIPTION OF THE PRIOR ART

In the prior referenced application the filtering characteristic of the voltage controlled oscillator (VCO) is a controlling function in the accuracy of the circuit. The operation of the phase locked loop is a key factor in determining the linearity of the A/D converter. In particular, the modulation at the VCO output, caused by the ripple in the VCO control voltage, must be adequately contained. A ripple component is present on top of a DC value which is determined by the bandwidth of the filtering network. The output of the low pass filter is applied directly to the VCO controlled input. In order for the ripple component not to cause problems, the ripple amplitude must be contained to a value which will maintain the sensitivity of the output frequency of the VCO to the change in input control voltage at an acceptable level. The filter requirements may start to make the capture and lock ranges of the phase lock loop become too small. The small range would put a severe restriction on other component tolerances and defeat the purpose of a phase locked loop.

The present invention solves this problem by filtering as much as possible while keeping an acceptable lock-in capture range. This makes it possible to put divide H counters in the phase-locked loop pre-stage and feedback path. The effect of these H counters is to reduce the ripple frequency by a factor of H while the output frequency of the VCO remains unchanged.

The invention has the advantage that since the filter is an integrator (linear amplifier) it produces a linear ramp function which means that the counter counts more at the beginning of the waveform then less and less so that the total count is the same as if it were a flat DC signal. That is, it accumulates counts fast in the beginning when the wave shape rises and then slower as the wave shape falls, and, therefore, the integrator does not add to the error. This makes the lock range very wide because the filter is not constrained to a low pass filter.

The foregoing and other objects, features and advantages of the invention will be apparent from the following more particular description of the preferred embodiment of the invention, as illustrated in the accompanying drawings.

BRIEF DESCRIPTION OF THE DRAWINGS

FIG. 3 is a waveform diagram of various points in the circuit of FIG. 1 when the circuit is phase locked.

FIG. 4 is a waveform diagram of various points of the circuit of FIG. 1 when the circuit is not phase locked, i.e. operating out of phase;

FIG. 5 illustrates an alternative embodiment of the invention especially suited for application in a digital volt-meter.

DETAILED DESCRIPTION

Figure 1:
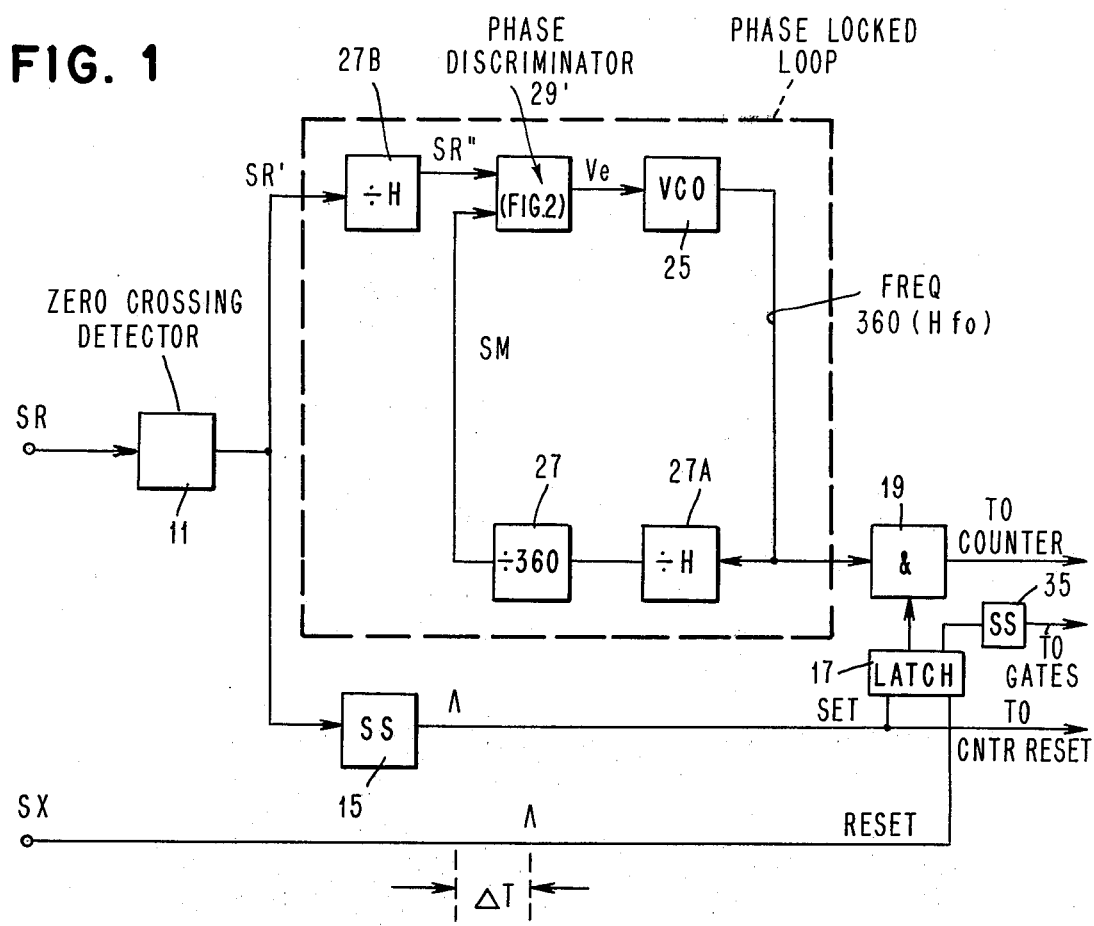
FIG. 1 is a schematic diagram of a phase locked loop in which the invention is embodied.

FIG. 1 is a schematic diagram of a circuit designed in accordance with a preferred embodiment of the invention. This circuit is part of a circuit shown in FIG. 1 of the above-identified Logue patent application. The drawing shows the improved portion itself and so much of the Logue circuit to show the connection of the present invention therewith. As described in the Logue application, the quantity to be encoded is the phase of the variable width cyclic pulse signal $S_X$ relative to the reference signal $S_R$. The variable ($S_X$) and reference ($S_R$) signals are periodically recurrent at the same frequency. The zero crossing of the reference signal $S_R$ is detected by the zero crossing detector 11. Circuit 11 fires a single shot 15 which generates a pulse at its output which sets latch 17. In the set condition the latch 17 enables AND circuit 19 which gates counting pulses to a digital counter not shown in this drawing. Ordinarily, the counter is reset to zero at the same time that the latch 17 is set.

The edge of the signal $S_X$ which marks the end of the variable interval $\Delta T$ is utilized to reset latch 17 and thereby terminate pulses gated through the AND 19. The count represents the digital value of interval $\Delta T$.

The counting pulses are generated by a low cost voltage controlled square wave oscillator 25 (VCO). The pulses are recurrent at a frequency which is a harmonic of the frequency of the reference signal $S_R$ and in the example shown the 360th harmonic is produced.

Figure 2:
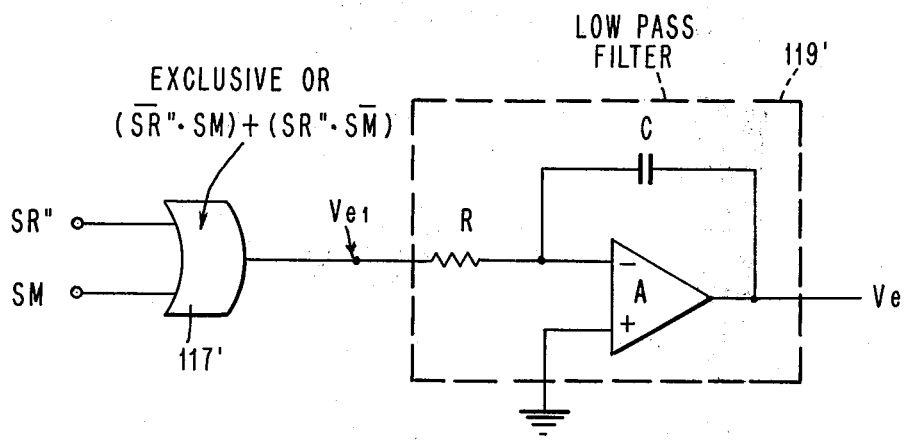
FIG. 2 is a schematic diagram of the phase discriminator circuit shown in block 29 of FIG. 1.

The output of the VCO 25 enters a feedback loop which includes the frequency divider 27 (which divides the frequency of the output by the harmonic factor) and a phase discriminator 29', which supplies the controlling input voltage to the VCO. Thus far, the circuit described is identical in block form with the circuit disclosed in the aforementioned Logue patent application. However, as described hereinafter two additional frequency dividers are added to the circuit. One frequency divider, 27A, is added to the feedback loop whereas the other, 27b, is added pre-stage to the phase discriminator 29'. In addition, the phase discriminator 29' has been modified as shown in FIG. 2.

Before describing the operation of the invention in detail, the theory of operation of the phase-locked loop producing accurate pulses will be briefly described. The phase discriminator 29' samples discrete portions of the reference signal $S_R$ under control of signal $S_M$ (modulation signal) from the divider circuit 27. The samples are filtered to provide an error voltage $V_e$ which is a function of the phase difference between $S_R$ and $S_M$. The error voltage $V_e$ is applied to the VCO thus completing a phase-locked loop. With the loop completed the output of the divider 27 is locked in a predetermined phase relationship with the reference signal $S_R$ imposing a predetermined frequency constraint on the VCO output. With the VCO output frequency 360 times the frequency of signal $S_R$, the count acquired by the counter between the time interval $\Delta T$ marked by successive zero crossings of $S_R$ and the leading edges of $S_X$ will be less subject to uncertainty arising from oscillator drift or jitter normally associated with open loop or crystal controlled oscillators. The count acquired by the counter will, therefore, more accurately represent the phase difference between $S_R$ and $S_X$.

The resetting of latch 17 by $S_X$ terminates the generation of pulses by AND circuit 19 to the counter and causes a single-shot 35 to produce a pulse which is used to energize a plurality of gates which transfer the contents of the counter in parallel to corresponding storage latches, not shown, which store the count.

In accordance with the present invention, in order to improve the accuracy of the phase locked loop, the capture range is increased. This accomplished by placing a frequency divider 27B in the input circuit to divide the frequency by a factor of H. H has been shown, for example, in FIGS. 3 and 4, as having a value of four. However, it should be understood that this is not critical to the present invention and any suitable value of H may be chosen depending upon other circuit parameters.

Another frequency divider, 27a, is placed in the feedback circuit in series with the frequency divider 27 to thereby cancel out the effect of adding the frequency divider in the input. In addition to adding a frequency divider the phase discriminator 29' is changed to include a low pass filter, which is an integrator instead of the differentiator shown in FIG. 2 of the above-identified Logue patent application. By using an integrator the error signal from the phase detector is a low level sawtooth signal which is not the case in the Logue patent application.

The phase discriminator of FIG. 2 is comprised of a phase detector exclusive OR 117' which exclusive OR's the signals $S_R''$ and $S_M$ to produce a voltage $V_e1$. This is illustrated by the diagram of FIG. 3 which shows the sinusoidal wave shape $S_R$ transformed by zero crossing detector 11 of FIG. 1 into a square wave $S_R1$. The divide H counter 27b further divides this square wave to produce the signal $S_R''$. Insertion of the divide H counter 27a in the feedback path results in a feedback signal $S_M$ which is also divided down by a factor of four. These two signals, $S_M$ and $S_R''$, are combined in the phase detector of FIG. 2 to produce the output voltage $V_e1$ at the point shown in FIG. 2. $V_e1$ enters the low pass filter 119' where it is integrated by the RC integration network and the amplifier A to produce a ramp function $V_e$ shown in FIG. 3. The ramp function rises toward the positive voltage produced by $V_e1$ until $V_e1$ changes to a negative value. At this point the RC network decays toward the negative voltage value of $V_e1$ to produce a negative going ramp. Since the diagram of FIG. 3 illustrates the circuit in a phase locked status there is zero level voltage and the linear ramp varies around the zero error voltage line indicated in FIG. 3. The result of this linear ramp being presented to the VCO 25 of FIG. 1 is that as the voltage rises more and more clock pulses are generated until the voltage starts to fall at which time less and less clock pulses are generated. However, the average number of clock pulses is equal so that the result is the same as if a constant DC voltage has been applied across the VCO. The circuit has the advantage that the ripple component does not cause variations in the accumulated count.

Referring to FIG. 4, when the circuit is not phase locked the divided waveform $S_R''$ and the feedback signal $S_M$ are out of phase causing a voltage wave shape $V_e1$ which is not symetrical. This causes an output voltage from the low pass filter 119 which resembles the wave shape $V_e$ shown in FIG. 4. This is a rising error voltage. This causes a feedback signal of a polarity and magnitude that tends to drive the VCO 25 to the desired stable phase-locked condition.

FIG. 5 is a block schematic diagram of the phase locked loop 111 shown in FIG. 5 of the Logue patent application which has been modified to incorporate the present invention. Similar numbered representation is used to identify identical blocks in the diagram. The phase detector 117 of the Logue application and the low pass filter 119 are replaced with the phase detector and low pass filter 117' and 119' shown in FIG. 2. Additionally, a divide H counter 115a is inserted in the pre-stage input path and a divide H counter 115b is inserted in the feedback path. The invention operates to improve the circuit substantially the same as described in FIG. 1. For a more complete description of the use of this phase lock loop in a voltage encoder, reference should be made to the Logue patent application.

While the invention has been particularly shown and described with reference to preferred embodiments thereof, it will be understood by those skilled in the art that various changes in form and detail may be made therein without departing from the spirit and scope of the invention.

What is claimed is:

1. In a frequency multiplication circuit having a continuously running VCO (voltage controlled oscillator), arranged in a phase locked loop controlled by a phase discriminator, for producing clock oscillation signals at a pedetermined harmonic of the frequency of recurrence of a cyclic reference signal — said clock oscillations being used intermittently for developing an encoded digital count representative of an analog magnitude, over discrete interval segments of a cycle of said reference input — the improvement comprising:
    means in said phase discriminator for constraining variations in the VCO control input, during said discrete interval segments of said cycle, to a predetermined form giving rise to invariably nullifying error contributions to said magnitude representation; said constraining means offsetting lock and capture properties of said loop from a desired norm; and
    means associated with inputs to said phase discriminator for compensating for said lock and capture offset caused by the introduction of said constraining means.

2. The improvement of claim 1 wherein said predetermined form is linear and said constraining means includes successive Exclusive-OR and pulse integration circuit stages.

3. The improvement of claim 2 wherein said compensating means comprises conprises identical frequency division circuit stages interposed in reference and feedback paths associated with inputs to said Exclusive-OR stage.

4. In circuit apparatus for converting a variable analog voltage to a digital count representation, said apparatus including an encode counter receiving intermittently gated clock oscillations under control of transitional phases of cyclically recurrent ramp timing signals having alternately positive and negative slope phases, said representation developing over an encoding-/counting cycle coincident with one cycle of said ramp signals — said clock oscillations produced by a VCO in a phase locked loop frequency multiplication circuit, said VCO tracking a harmonic of the recurrence frequency of said ramp timing signals, said loop including a phase discrimination circuit stage providing a varying control voltage, to control the frequency of said VCO, in response to phase differences between reference input signals synchronous with said ramp signals and loop feedback signals derived by frequency division of the VCO clock output — the improvement, for nullifying encoding errors due to deviation from a predetermined form of the form of variation of the VCO control input over a said encoding/counting cycle, comprising:
 circuits in said phase discrimination stage for constraining variations in the VCO control input to said predetermined form over each encoding cycle; whereby error contributions to the final encoded count, due to said variations, are nullifying over said cycle.

5. Apparatus according to claim 4 wherein said reference input signals are binary pulses and said form constraining circuits in said phase discrimination stage comprise successive Exclusive-OR and pulse integration circuit stages; said apparatus including identical first and second frequency division circuit stages interposed seriately in the paths of the reference input and feedback input to said phase discrimination stage to compensate for offset of lock and capture characteristics of said phase locked loop due to the introduction of said Exclusive-OR stage.

* * * * *